United States Patent

Wada et al.

Patent Number: 5,797,062
Date of Patent: Aug. 18, 1998

[54] MEASURING DEVICE FOR AMOUNT OF CHARGE OF DEVELOPER

[75] Inventors: Takasumi Wada; Yoichi Yamamoto, both of Nara; Keiji Taniguchi, Fukui, all of Japan

[73] Assignee: Sharp Kabushiki Kaisha, Osaka, Japan

[21] Appl. No.: 719,451

[22] Filed: Sep. 25, 1996

[30] Foreign Application Priority Data

Oct. 23, 1995 [JP] Japan .................................. 7-274488

[51] Int. Cl.⁶ ...................... G01R 29/24; G03G 15/00
[52] U.S. Cl. ............................ 399/29; 399/53; 324/452
[58] Field of Search ........................ 399/27, 29, 53, 399/61; 324/452

[56] References Cited

U.S. PATENT DOCUMENTS

| | | | |
|---|---|---|---|
| 4,242,434 | 12/1980 | Hirakura et al. | 430/122 |
| 4,343,548 | 8/1982 | Bares et al. | 399/61 |
| 4,397,184 | 8/1983 | Bankert et al. | 399/63 |
| 5,034,775 | 7/1991 | Folkins | 399/55 |
| 5,486,900 | 1/1996 | Wada et al. | |

OTHER PUBLICATIONS

Published Japanese Patent Application No. 287169, Published Dec. 14, 1987, T. Kyosuke, et al.
Published Japanese Patent Application No. 25154, Published Jan. 27, 1989, H. Nakamura, et al.
Published Japanese Patent Application No. 25772, Published Jan. 29, 1992, Y. Tabata.

*Primary Examiner*—Joan H. Pendegrass
*Attorney, Agent, or Firm*—David C. Conlin; William J. Daley, Jr.

[57] ABSTRACT

A measuring device for amount of charge of developer includes an upper electrode, a lower electrode provided under the upper electrode, which are provided in parallel so as to face each other, flying electric field voltage application unit for applying a flying electric field voltage to the upper electrode, for generating an electric field so as to fly developer from the lower electrode to the upper electrode, current detection unit for detecting a current flowing in the upper electrode, and arithmetic unit for computing a total amount of charge of the developer adhering to the upper electrode based on a change in amount of current detected by the current detection unit, wherein a current that generates as a toner T adheres to the upper electrode is detected by the current detection unit, and based on a change in amount of the current, a total amount of charge of the developer adhering to the upper electrode is computed by the arithmetic unit. As a result, the measuring device for amount of charge of developer can be obtained at low cost.

16 Claims, 9 Drawing Sheets

MEASURING DEVICE FOR AMOUNT OF CHARGE OF DEVELOPER

FIELD OF THE INVENTION

The present invention relates to a measuring device for amount of charge of developer used as visualizing particles in an image forming apparatus of an electrophotographic printing system such as a copying machine.

BACKGROUND OF THE INVENTION

In electrophotographic printing devices such as copying machines, etc., toner particles are used as a developer, and the toner particles are charged when using them in forming images. The amount of charge of the toner particles is the important factor to determine an image quality, and various methods have been developed for measuring an amount of charge.

One known measuring method for an amount of charge of toner is the blow-off method. In the blow-off method, an amount of charge of toner particles in a two-component developer composed of toner particles and carrier particles is measured specifically in the following manner. First, the two-component developer is placed on a holding member with meshes bigger than the diameter of a toner particle and smaller than a diameter of a carrier particle, and only the toner particles are blown off by dry air blow (for example, nitrogen gas). Then, an amount of charge of the residual carrier particles remaining on the support member is measured to determine an amount of charge by weight of toner. The described blow-off method has been widely used as a measuring method of an amount of charge per unit weight. The blow-off method, however, has the following drawbacks. The measured value fluctuates with flow of dry air blow and a measuring time, and this makes it difficult to measure an amount of charge of toner successively. Also, this method cannot be applied to the one-component developer of toner particles without including the carrier particles, and even for the two-component developer, distribution of the amount of charge cannot be measured.

To meet a recent demand for high quality image, uniform toner particles of a smaller diameter, each having a uniform amount of charge and a uniform diameter of particles are required. For the measuring methods for amount of charge of developer which can be applied to the described toner developer, those disclosed in (1) Japanese Laid-Open Patent Application No. 287169/1987 (Tokukaisho 62-287169), (2) Japanese Laid-Open Patent Application No. 25154/1989 (Tokukaisho 64-25154), and (3) Japanese Laid-Open Patent Application No. 25772/1992 (Tokukaihei 4-25772) are known.

In the measuring method of the Gazette (1), charged particles are dropped by the dead weight in an electric field, and the dropping velocity and the trace thereof are detected by an image pickup unit. Then, an amount of charge is calculated based on the result of detection. In the measuring method of the Gazette (2), the toner particles are conveyed in the DC electric field by an air-flow, and a distance the toner particle moves is detected by a line image sensor to determine the specific charge distribution of the toner particles. In the method of the Gazette (3), the electric field is applied to the toner particle flow, and the toner particle group in the electric field is observed by a magnifying optical system to determine the amount of charge of toner based on the information indicative of distance the toner moves and the particle diameter.

However, in the described conventional arrangements, the toner particles are picked up by the image pick-up unit, and the resulting information is processed by the image processing unit to obtain the amount of charge of toner particles, etc. Namely, the conventional arrangements require valuable devices such as the image pick-up unit, the image processing unit, etc., thereby presenting the problem of high cost.

SUMMARY OF THE INVENTION

An object of the present invention is to provide a measuring device for amount of charge of developer at low cost.

In order to achieve the above object, a measuring device for amount of charge of developer of the present invention includes:

an upper electrode;

a lower electrode provided under the upper electrode, the upper electrode and the lower electrode being provided in parallel so as to face each other;

a flying electric field voltage application unit for applying a flying electric field voltage to the upper electrode, the flying electric field voltage generating an electric field which allows a developer to fly from the lower electrode to the upper electrode;

a current detection unit for detecting a current flowing in the upper electrode; and an arithmetic unit for computing a total amount of charge of the developer adhering to the upper electrode based on a change in amount of current detected by the current detection unit.

According to the described arrangement, the developer particles, an amount of charge of which is to be measured are placed on the lower electrode. In this state, with an application of the flying electric field voltage by the flying electric field voltage application unit, an electric field is generated so that the developer flies from the lower electrode towards the upper electrode. As a result, the developer on the lower electrode adheres to the upper electrode. Then, a current in accordance with an amount of charge of the adhered developer flows in the upper electrode, and is detected by the current detection means. Further, the arithmetic unit computes a total amount of charge of the developer adhered to the upper electrode based on a change in amount of current detected by the current detection unit, i.e., an amount of increase of the current by the charged developer adhering to the upper electrode.

As a result, a measuring device for amount of charge of developer can be achieved at low cost compared with the conventional measuring device in which an image of the developer is picked up by the image pick-up unit, and an amount of charge of the developer is measured by the image processing unit.

The novel features which are considered as characteristic of the invention are set forth in particular in the appended claims. The improved treatment method, as well as the construction and mode of operation of the improved treatment apparatus, will, however, be best understood upon perusal of the following detailed description of certain specific embodiments when read in conjunction with the accompanying drawings.

DETAILED DESCRIPTION OF THE PREFERRED EMBODIMENTS

First Embodiment

The following descriptions will discuss one embodiment of the present invention in reference to FIG. 1 through FIG. 6.

Figure 1:
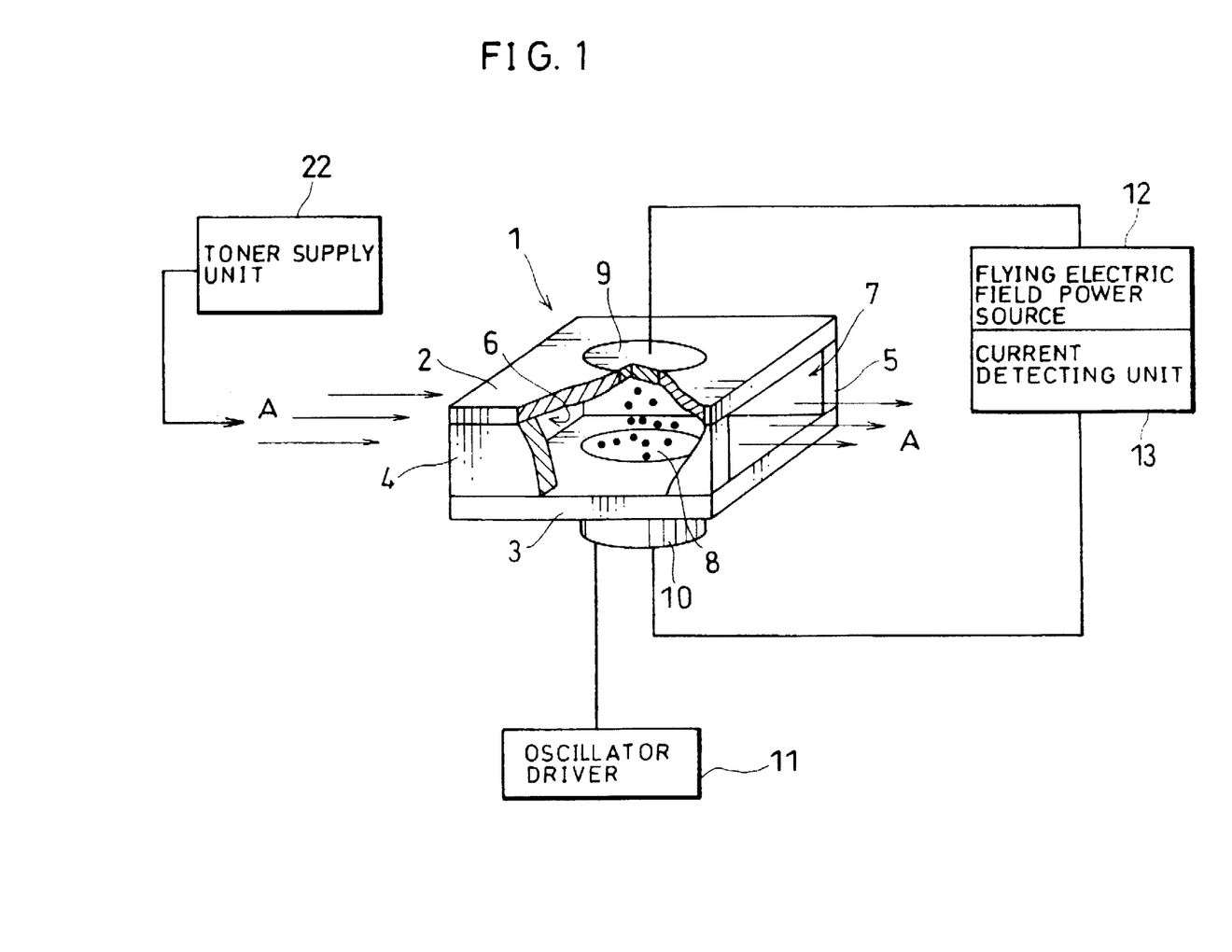
FIG. 1 is an explanatory view schematically showing an entire structure of a measuring device for amount of charge of developer in accordance with one embodiment of the present invention with a perspective view of a measuring chamber and a block diagram of respective means connected thereto.

As shown in FIG. 1, a measuring device for amount of charge of developer in accordance with the present embodiment is provided with a measuring chamber 1. The measuring chamber 1 includes an upper wall portion 2, a lower wall portion 3 and two side wall portions 4 and 5. The lower wall portion 3 is horizontally formed, and the upper wall portion 2 and the lower wall portion 3 are formed in parallel so as to face each other. The side wall portions 4 and 5 also are formed in parallel so as to face each other. In the described arrangement, there are no side walls adjacent to the side wall portions 4 and 5 and openings 6 and 7 are formed therebetween.

Figure 3:
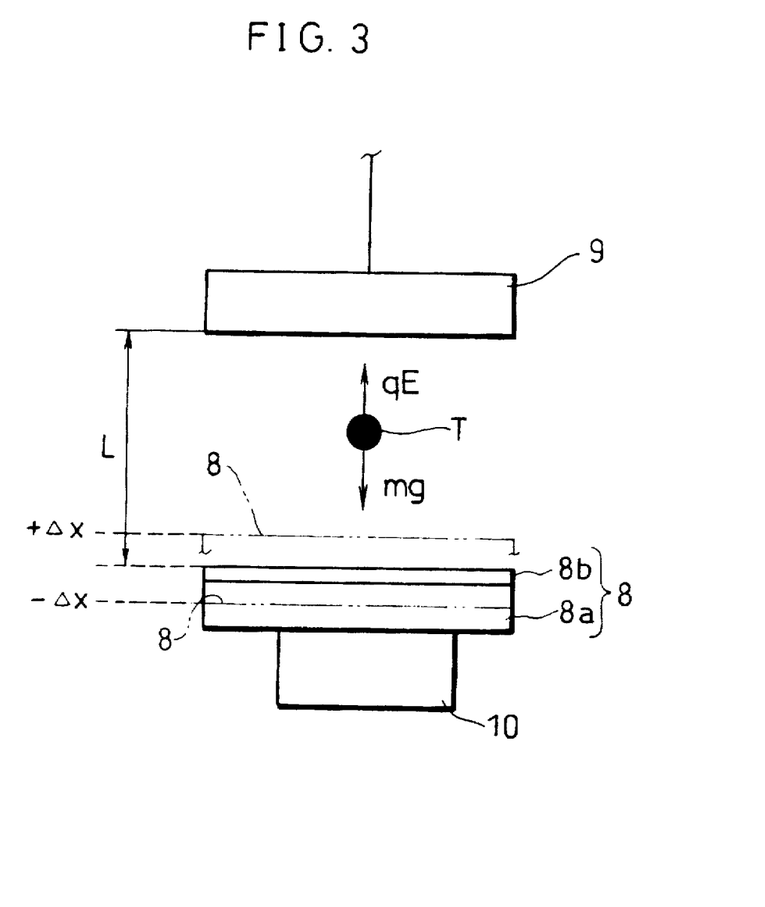
FIG. 3 is an explanatory view showing an operation where the toner is moved from a lower electrode to an upper electrode between the lower electrode and the upper electrode shown in FIG. 1.

The lower wall portion 3 has a lower electrode 8 exposed to the upper surface thereof. The upper wall portion 2 has an upper electrode 9 that is exposed to the lower surface thereof and faces the lower electrode 8. The lower electrode 8 is capable of oscillating up and down. As shown in FIG. 3, the lower electrode 8 includes an electrode section 8a and an insulating layer 8b, for example, with a thickness of 30 μm, formed on the upper surface of the electrode section 8a.

An oscillator 10 is provided on the back surface of the lower electrode 8. A movable portion of the oscillator 10 is connected to the back surface of the lower electrode 8. The oscillator 10 is connected to an oscillator driver 11 for supplying thereto a drive voltage. The oscillator 10 and the oscillator driver 11 constitute an oscillation means. Upon receiving the drive voltage, the oscillator 10 oscillates up and down. The oscillation frequency of the oscillator 10 is preferably in a range of from 100 to 1,000 Hz, more preferably in a range of from 700 to 900 Hz, and most preferably 800 Hz.

The measuring device for amount of charge of developer further includes a flying electric field power source unit 12 (flying electric field voltage application means) for applying a flying electric field voltage which generates an electric field between the lower electrode 8 and the upper electrode 9 so as to fly a toner T from the lower electrode 8 to the upper electrode 9. The toner T that flies from the lower electrode 8 adheres to the upper electrode 9. As a result, a current flows in the upper electrode 9 and is detected by a current detection unit 13 (current detection means).

The respective arrangements of the flying electric field power source unit 12 and the current detection unit 13 will be explained with reference to FIG. 2. The current detection unit 13 includes an amplifier 14, a resistor 15, a condenser 16, a reset switch 17 and an analog/digital converter (hereinafter referred to as an AD converter) 18. The AD converter 18 is provided for converting an electric analog signal to an electric digital signal.

An arithmetic unit 19 (arithmetic means) is connected to the current detection unit 13, and a control unit 20 is connected to the arithmetic unit 19. The arithmetic unit 19 is provided for computing an amount of charge based on an output from the AD converter 18 in a manner to be described later. The control unit 20 is provided for controlling respective operations of the flying electric field power source unit 12, the reset switch 17, the oscillator driver 11, the switch 21 and a toner supply unit 22 (to be described later), etc.

Here, the output voltage of the flying electric field power source unit 12 is variable. The flying electric field power source unit 12 is shown in FIG. 2 such that a voltage of an opposite polarity to the toner, i.e., a positive voltage is applied to the upper electrode 9; however, voltages of both positive and negative are applicable and suitably selected. Namely, for example, when the group of toner particles shows a negative polarity as a whole, it does not mean that all the toner particles show negative polarity, and those having positive polarity may be included. Therefore, in order to permit the measurement of toner particles of opposite polarities, it is required that the flying electric field power source unit 12 can apply voltages of both negative and positive polarities to the upper electrode 9. The flying electric field power source unit 12 is connected to the upper electrode 9 through the switch 21.

One input terminal 14a of the amplifier 14 is connected to an output terminal of a negative electrode of the flying electric field power source unit 12 through the resistor 15. Between the input terminal 14a and an output terminal 14c of the amplifier 14, and connected in parallel, are the condenser 16 and the reset switch 17. The other input terminal 14b of the amplifier 14 is connected to the lower electrode 8. The output terminal 14c of the amplifier 14 is connected to an input section of the AD converter 18, and the output section of the AD converter 18 is connected to an input section of the arithmetic unit 19.

The measuring chamber 1 shown in FIG. 1 includes the toner supply unit 22. The toner supply unit 22 is arranged so as to supply the group of toner T to be measured onto the lower electrode 8 in the measuring chamber 1. After the measurement, the toner supply unit 22 removes the used toner T for the measurement remaining on the lower electrode 8. The toner supply unit 22 is provided with air-suction means or air-blowing means such as an air pump, etc. The toner supply unit 22 enables the toner to be transported with an air-flow A onto the lower electrode 8 through the opening 6 of the measuring chamber 1.

The air-flow A is required to be strong enough to transport a sufficient amount of toner T. Therefore, the suction means or the air-blowing means of simple structure may be adopted. For example, when the measuring device for amount of charge of developer is a part of the image forming device, an air-flow generated with rotations of a rotatable member, such as a developer roller, etc., may be used. Additionally, as the toner T is used in a small amount for the measurement, the properties of the toner particles would not change by the measurement. This permits the toner T to be used again by placing it back in the developer unit after the measurement.

In the described arrangement, when a measurement of an amount of charge of the toner T is to be carried out in the measuring device for amount of charge of developer, first, the inside of the measuring chamber 1 is cleaned. Specifically, the air-flow A is supplied to the inside of the measuring chamber 1 by the toner supply unit 22 to remove foreign substances on the lower electrode 8. Here, the lower electrode 8 and the upper electrode 9 are of the same potentials, for example, 0 V (earth potential). Next, the group of the toner T to be measured is placed on the lower electrode 8 of the measuring chamber 1 by the toner supply unit 22 so as to generate the air-flow A from the opening 6 towards the opening 7, thereby blocking the air-flow A when the group of the toner T reaches on the lower electrode 8.

Then, the oscillator driver 11 is actuated, and subsequently, the switch 21 is set ON to actuate the flying electric field power source unit 12 and the current detection unit 13. Upon actuating the flying electric field power source unit 12, a flying electric field voltage is applied to the upper electrode 9. As a result, a toner flying electric field is generated between the lower electrode 8 and the upper electrode 9, so the toner T flies from the lower electrode 8 towards the upper electrode 9. The described electric field makes the toner T on the lower electrode 8 fly towards the upper electrode 9 and to be attracted thereto.

When the oscillator driver 11 is actuated in the described manner, as shown in FIG. 3, the lower electrode 8 oscillates up and down, i.e., in a vertical direction in a range of from $+\Delta x$ to $-\Delta x$ at a predetermined frequency. This oscillation of the lower electrode 8 makes the toner particles which form a clod to be scattered on the lower electrode 8. With an application of the toner flying electric field, a distance L between the lower electrode 8 and the upper electrode 9 varies due to the oscillation of the lower electrode 8, which in turn makes the toner flying electric field to vary. Furthermore, the oscillation of the lower electrode 8 also cause the toner T to oscillate; however, as particles of the toner T cannot follow the oscillation of the lower electrode 8 due to a difference between the acceleration by the gravity (mg) and the acceleration by the oscillation of the lower electrode 8, the toner T is kept away from the lower electrode 8. Therefore, the toner T on the lower electrode 8 becomes like smoke. In this state, when the toner flying electric field is applied to the toner T, each particle of the toner T can fly from the lower electrode 8 to the upper electrode 9 with ease. Here, when the strength of the toner flying electric field and the amount of charge of toner T are designated respectively by E and q, a force exerted onto the toner T by the toner flying electric field is expressed by qE. The toner particles T which satisfy the condition of qE>mg reach the upper electrode 9.

The described oscillation of the lower electrode 8 also suppresses the effect of an image force onto the toner T on the lower electrode 8. This also contributes to urging the toner T to appropriately fly from the lower electrode 8 to the upper electrode 9. The image force is exerted so as to attract the toner T onto the lower electrode 8 by the following mechanism. When the charged toner particles come in contact with an electrode plate, composed of an electrically conductive member, a charge generates in the electrode plate so as to cancel out the charge of the toner particles. The charge in the inside of the electrode plate and the toner particles form a symmetrical distribution with respect to a contact face (electrode plate surface) between the toner particles and the electrode plate so the charge has an opposite polarity to the toner particles. As a result, an attraction force is exerted onto the toner particles.

Furthermore, the lower electrode 8 has an insulating layer 8b on the surface thereof, which also con tributes to suppressing the effect of the image force. Namely, by covering the surface contacting the toner T of the lower electrode 8 with the insulating film 8b, contact between the toner T and the lower electrode 8 is prevented.

Furthermore, as the charge is not likely to generate in the insulating layer 8b so as to cancel out the charge of the toner T, the image force can be suppressed. After suppressing the image force, only the force exerted in the direction of the lower electrode 8 to be applied to the toner T is the gravity. Therefore, the toner T can fly from the lower electrode 8 with ease. As a result, the amount of charge of the toner T can be measured accurately.

When measuring the amount of charge of the toner T, the flying electric field power source unit 12 switches the flying electric field voltage, to be applied to the upper electrode 9, in a direction of accelerating the toner T to fly from the insulating layer 8b onto the upper electrode 9. For example, when the group of the toner T is charged only to the negative polarity, a positive low voltage is applied first to the upper electrode 9, and then it is switched to apply a positive high voltage. For example, in the case where the group of the toner T shows a negative polarity as a whole, but includes the toner particles of the positive polarity, a negative voltage is applied first to the upper electrode 9, and then it is switched to apply a positive high voltage. Here, the upper limit voltage may be set to 500 V.

When the flying electric field voltage is switched, the toner T that reaches the upper electrode 9 has a charge q that satisfies the condition of qE>mg. Therefore, among the group of the toner T on the lower electrode 8, the toner particles reaching the upper electrode 9 are in order from that having the largest amount of charge. In this case, the toner T that has a small amount of charge which does not satisfy the above inequality does not reach the upper electrode 9. However, by switching the flying electric field voltage as described above, the toner T that has a small amount of charge also reaches the upper electrode With an applied predetermined flying electric T reaches the upper electrode 9, a current in response to an amount of charge of the toner T flows in the upper electrode 9 when the toner T reaches the upper electrode 9. Here, the reset switch 17 of the current detecting section 13 is switched OFF. Therefore, the condenser 16 is charged by the current, i.e., the charges of the toner particles T that reach the upper electrode 9, thereby increasing an output voltage of the amplifier 14.

An output voltage of the amplifier 14 is inputted to the AD converter 18, and after being converted to the digital signal, it is inputted to the arithmetic unit 19. In the arithmetic unit 19, respective amounts of charge obtained through the AD converter 18 are summed to determine a total amount of charge with an applied predetermined flying electric field voltage. The described arrangement of calculating the amount of charge of toner T offers the beneficial feature of low cost over the conventional arrangement where an image of the toner T is picked up by the pick-up unit, and the amount of charge of the toner T is determined by the image processing unit.

When the total amount of charge with an applied predetermined flying electric field voltage is calculated in the described manner, the reset switch 17 is set ON, and the charges stored in the condenser 16 are released. Thereafter, the reset switch 17 is set OFF again, and the flying electric field voltage is switched subsequently. Then, the total amount of charge is measured with an application of each flying electric field voltage in the described manner.

Upon completing the measurement, respective operations of the oscillator driver 11, the flying electric field power source unit 12 and the current detection unit 13 are stopped. In the meantime, the air-flow A is introduced into the measuring chamber 1 by the toner supply unit 22 for cleaning. As a result, the used toner T for the measurement in the measuring chamber 1 is removed. Both the air-flow A including the toner T and that without including the toner T may be adopted. In the case of continuously carrying out a measurement, as the toner T can be placed on the lower electrode 8 with an introduction of the air-flow A, it is preferable to adopt the air-flow low A including the toner T. When cleaning, by oscillating the lower electrode 8 by actuating the oscillator driver 11, the toner T can be prevented from adhering to the lower electrode 8, thereby achieving an improved cleaning effect. Instead of applying the air-flow A to the toner supply unit 22, a mechanical cleaning unit, for example, a cleaning member may be installed in the measuring chamber 1.

Figure 4:
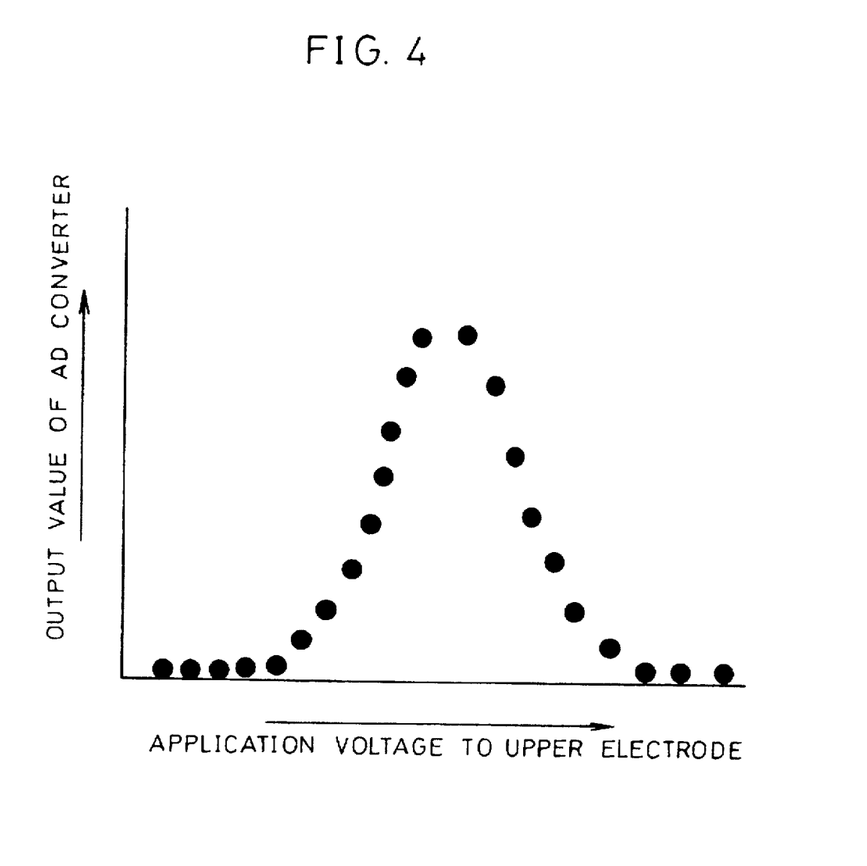
FIG. 4 is a graph showing a correlation between an output value of an AD converter shown in FIG. 2 and an application voltage to the upper electrode.
Figure 5:
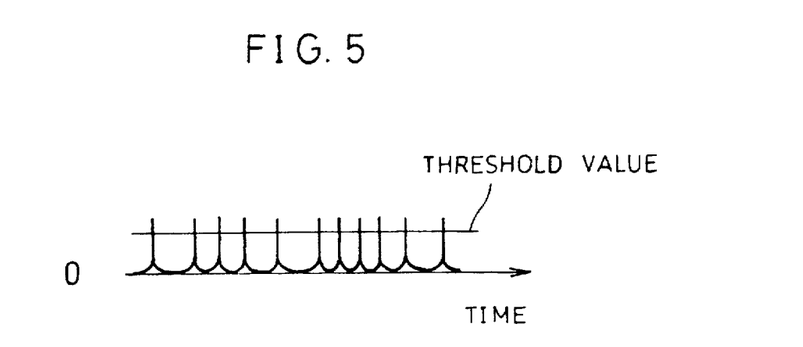
FIG. 5 is a waveform diagram of a current that flows as the toner reaches the upper electrode shown in FIG. 2.

The total amount of charge at each flying electric field voltage is in proportion to the number of toner particles T that reach the upper electrode 9. Therefore, the result of the described measurement enables the distribution of the amount of charge to the group of the toner T to be determined with ease. An example of the result of measurement of a distribution of the amount of charge is shown in FIG. 4. The results of the measurement shown in FIG. 4 are obtained under the condition where the distance L between the lower electrode 8 and the upper electrode 9 is 1 mm; the oscillating frequency of the oscillator 10 is 500 Hz; and the flying electric field voltage is raised each time by 20 V.

In the measuring device for amount of charge of developer of the present embodiment, as the toner T becomes like smoke by the oscillation of the lower electrode 8, an amount of charge of each toner T can be obtained. Because of the described beneficial characteristic that the toner T on the lower electrode 8 be comes like smoke, a distance between the electrode 9 and each toner T varies. Therefore, when a predetermined flying electric field voltage is applied to the upper electrode 9, each toner particle reaches the upper electrode 9 at different times. Therefore, to the upper electrode 9, a pulse-like current shown in FIG. 5 flows in response to the timing of the tones T as it reaches the upper electrode 9. Therefore, by counting a signal of each current pulse current in the arithmetic unit 19, the number of the toner T can be obtained. Further, by dividing the total amount of charge with an application of a predetermined flying electric field voltage to the upper electrode 9 by the number of the toner particles T, an amount of charge of each toner particle T can be obtained.

Figure 6:
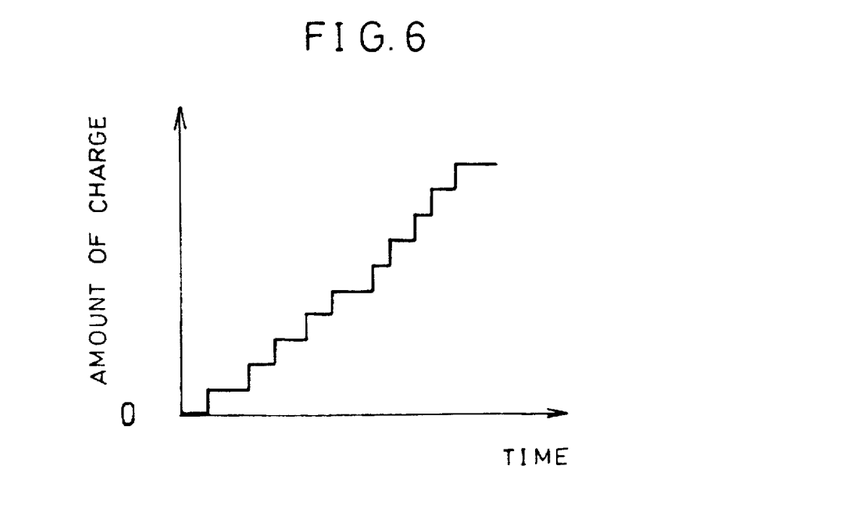
FIG. 6 is a graph showing a change in total amount of charge obtained by summing a current value shown in FIG. 5 with an applied predetermined flying electric field voltage.

With an application of a predetermined flying electric field voltage to the upper electrode 9, the respective amounts of charge to be summed in the arithmetic unit 19 increase, for example, in the state shown in FIG. 6. Therefore, the number of the toner particles T can be calculated based on a change in amount of charge. For example, a change in amount of charge obtained by the differentiation is counted as one toner particle T, and the number of toner particles T is determined. From the resulting number of toner T and the total amount of charge, an amount of charge for each toner particle T can be determined in the described manner.

It is also possible to determine a total amount charge by the integration of the current value measured when respective toner particles T reach the upper electrode 9.

Although the above explanations have been given through the case where, first, the group of the toner T is placed on the lower electrode 8, and then the measurement is carried out by varying successively a flying electric field voltage, it may be arranged such that the measurement is carried out by replacing the toner T for each flying electric field voltage. Specifically, upon completing the measurement of an amount of charge of the toner T at a predetermined flying electric field voltage, the toner supply unit 22 is actuated to supply the group of the toner T in the measuring chamber 1, while removing the toner T in the measuring chamber to vary the flying electric field voltage.

Second Embodiment

Figure 7:
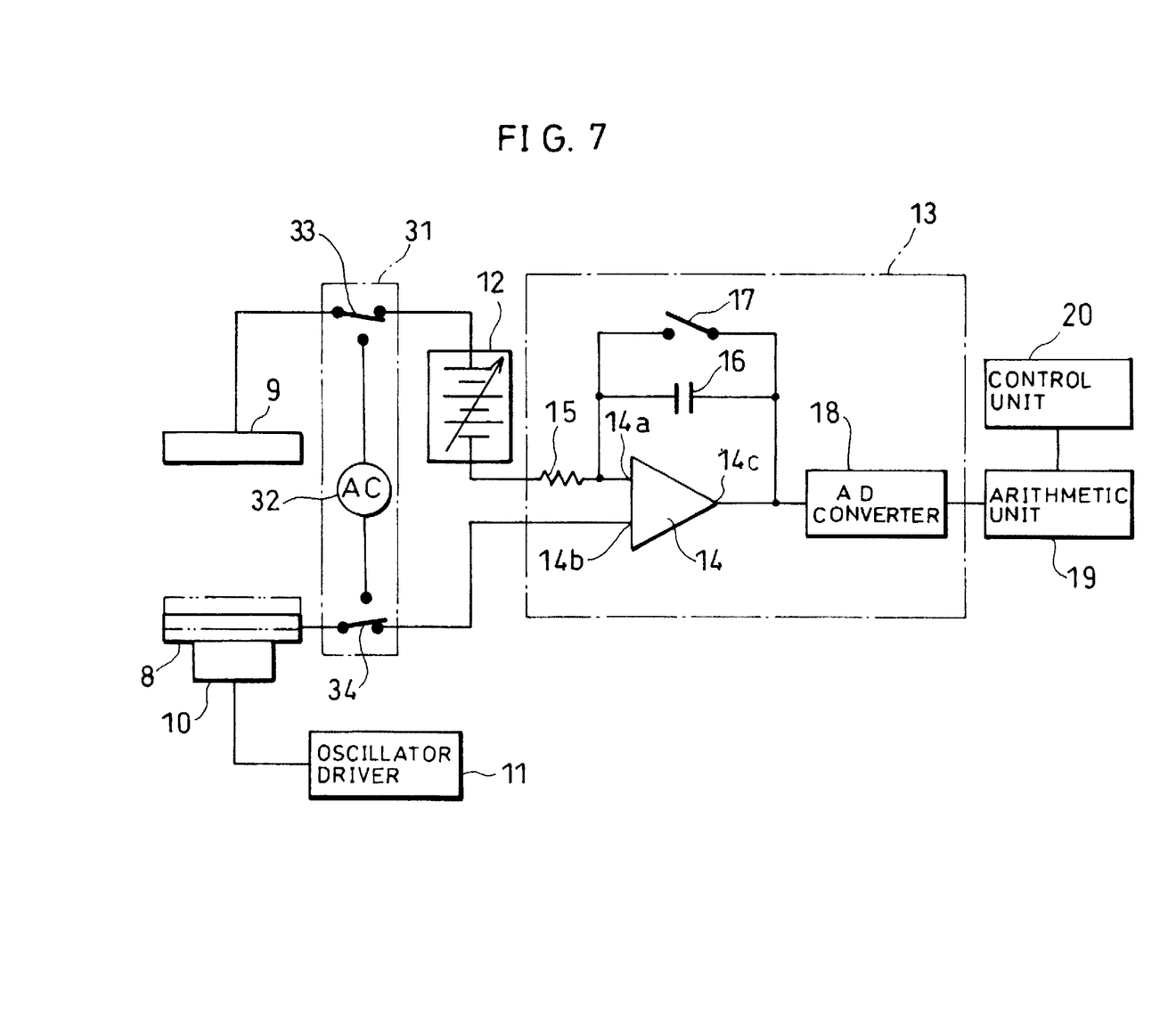
FIG. 7 is a circuit diagram showing a structure of a measuring device for amount of charge of developer in accordance with another embodiment.

The following descriptions will discuss another embodiment of the present invention with reference to FIG. 7. For convenience in explanations, members having the same function as those of the first embodiment will be designated by the same reference numerals, and thus the descriptions thereof shall be omitted here.

As shown in FIG. 7, a measuring device for amount of charge of developer in accordance with the present embodiment is provided with a cleaning voltage supply unit 31. The cleaning voltage supply unit 31 and aforementioned toner supply unit 22 constitute a cleaning unit. Other arrangements are the same as the measuring device for amount of charge of developer of the first embodiment.

The cleaning voltage supply unit 31 includes a power source unit 32, and two switches 33 and 34. The power source unit 32 is provided for outputting an alternating voltage. One switch 33 is provided between the flying electric field power source unit 12 and the upper electrode 9, and performs a switching operation between one state where the upper electrode 9 is connected to the flying electric field power source unit 12, and another state, where the upper electrode 9 is connected to the power source unit 32. The second switch 34 is disposed between the lower electrode 8 and the input terminal 14b of the amplifier 14, and is switched between one state, where the lower electrode 8 is connected to the input terminal 14b and another state, where the lower electrode 8 is connected to the power source unit 32. The switches 33 and 34 are interlocked with each other to switch between the power source unit 32 and the other side. The operation of the cleaning voltage supply unit 31 is controlled by the control unit 20.

Figure 2:
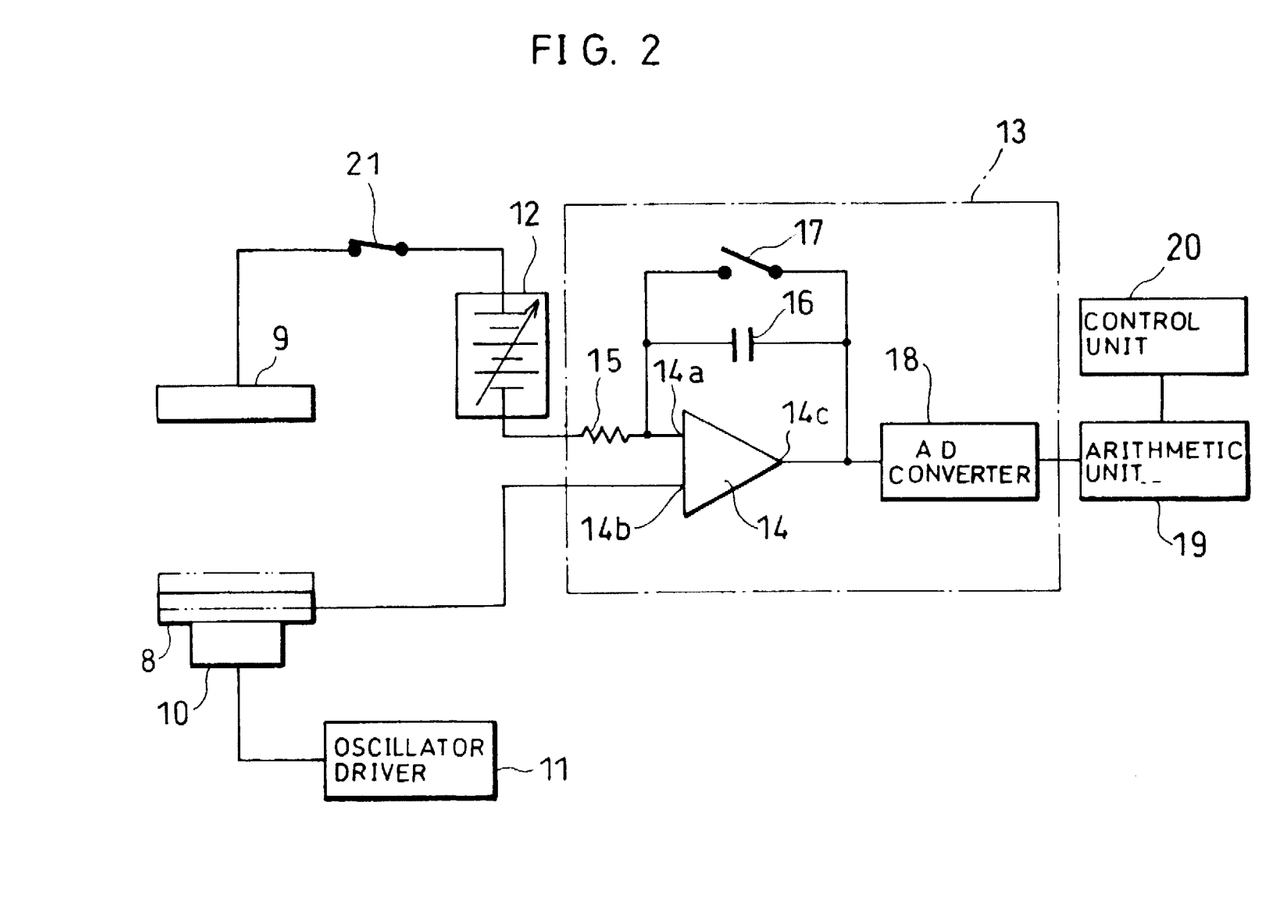
FIG. 2 is a circuit diagram of a flying electric field power source unit and a current detection unit connected to the measuring chamber shown in FIG. 1.

Except when cleaning, the measuring device for amount of charge of developer of the present embodiment operates in the same manner as the measuring device for amount of charge of developer shown in FIG. 2. The switches 33 and 34 of the cleaning voltage supply unit 31 are switched between the state where the upper electrode 9 is connected to the flying electric field power source unit 12 and the state where the lower electrode 8 is connected to the input terminal 14b.

On the other hand, when cleaning, the switches 33 and 34 are switched to the power source unit 32, and an output voltage of the power source unit 32 is applied to the lower electrode 8 and the upper electrode 9. Further, the air-flow A is applied from the toner supply unit 22 to the inside of the measuring chamber 1. As a result, an alternating electric field is generated between the lower electrode 8 and the upper electrode 9, and a cleaning of the inside of the measuring chamber 1 is desirably performed.

When the toner flying electric field is cancelled during a cleaning operation, the toner T adhered to the upper electrode 9 drops onto the lower electrode 8 by its dead weight. However, some particles of the toner T would still adhere onto the upper electrode 9 due to a difference in characteristics. Then, by applying an alternating electric field between the lower electrode 8 and the upper electrode 9, an electric field can be applied in the direction opposite to the direction of adhering onto the upper electrode 9 to remove the residual toner T from the upper electrode 9. Furthermore, as the distribution of the amount of charge of the group of the toner T ranges from the positive to negative in most cases, it is preferable to perform a cleaning operation with an application of the alternating electric field.

An appropriate cleaning operation by the cleaning device is performed in the following manner. Prior, to the measurement of the amount of charge of the toner T, the alternating electric field is exerted between the lower electrode 8 and the upper electrode 9, and the air-flow A carrying the toner T is supplied to the measuring chamber 1 from the toner supply unit 22. As a result, residual toner T and foreign substances remaining in the measuring chamber 1 are removed. Next, the respective voltages of the lower electrode 8 and the upper electrode 9 are set to 0 V to stop the air-flow A. As a result, the toner T to be measured remains on the lower electrode 8. Thereafter, the measurement is performed in the described manner.

In the described cleaning operation, by setting the output of the power source 32 to 500 V, 800 Hz, the residual toner T in the measuring chamber 1 can be completely removed. As to the toner used in the normal electrophotographic printing system, when the distance L between the lower electrode 8 and the upper electrode 9 is set to 1 mm, an appropriate cleaning function can be obtained in a range of 300 to 1,000 V, and 100 to 2 kHz.

Third Embodiment

The following descriptions will discuss another embodiment of the present invention with reference to FIG. 1 through FIG. 8. For convenience in explanations, members having the same function as those of the first embodiment will be designated by the same reference numerals, and thus the descriptions thereof shall be omitted here.

Figure 8:
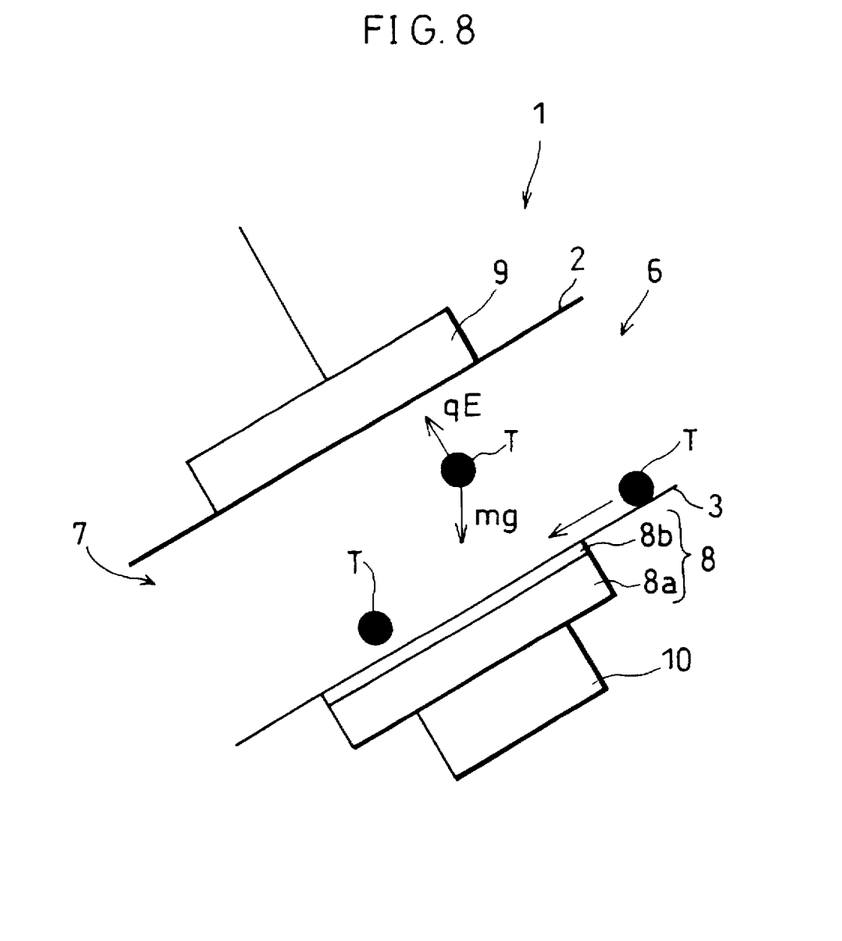
FIG. 8 is an explanatory view schematically showing a structure of a measuring chamber of a measuring device for amount of charge of developer in accordance with a still another embodiment.

As shown in FIG. 8, a measuring device for amount of charge of developer in accordance with the present embodiment is arranged such that the lower electrode 8 and the upper electrode 9 are formed in parallel so as to face each other, and are inclined with respect to the horizontal direction. Therefore, the lower wall portion 3 and the upper wall portion 2 of the measuring chamber 1 are also inclined in accordance with the slope of the lower electrode 8 and the upper electrode 9. In the measuring chamber 1, the upper portion of the slope corresponds to the opening 6, while the lower portion of the slope corresponds to the opening 7. In accordance with the described measuring chamber 1, the toner supply unit 22 supplies the toner T to the lower electrode 8 by the dead weight of the toner T not by the air-flow. Other arrangements of the measuring device for amount of charge of the developer are the same as the measuring device for amount of charge of the developer adopted in the first embodiment.

In the described arrangement, when measuring the amount of charge of the toner T, the toner T is successively supplied, for example, from the toner supply unit 22 onto the lower wall portion 3 of the measuring chamber 1. The toner T thus supplied rolls on the lower wall portion 3 by its dead weight, and upon reaching the lower electrode 8, the toner T is flied to reach the upper electrode 9 by the toner flying electric field. The flying electric field voltages sequentially change while the toner T is being supplied continuously. In the measurement, by actuating the oscillator 10, the toner T on the lower electrode 8 becomes like smoke. As a result, a measurement can be performed with a still improved accuracy.

The described arrangement is achieved by the measuring device for amount of charge of developer wherein the toner T that reaches the upper electrode 9 is detected by the current detection unit 13, and based on an amount of change of the current, a total amount of charge is calculated by the arithmetic unit 19.

The described arrangement of the measuring device for amount of charge of developer further permits a simplified structure of the toner supply unit 22, and the toner T to be easily removed from the lower electrode 8, thereby permitting an easy cleaning of the measuring chamber 1. Here, the cleaning may be performed by introducing the air-flow A into the measuring chamber 1 by the toner supply unit 22.

Fourth Embodiment

Figure 9:
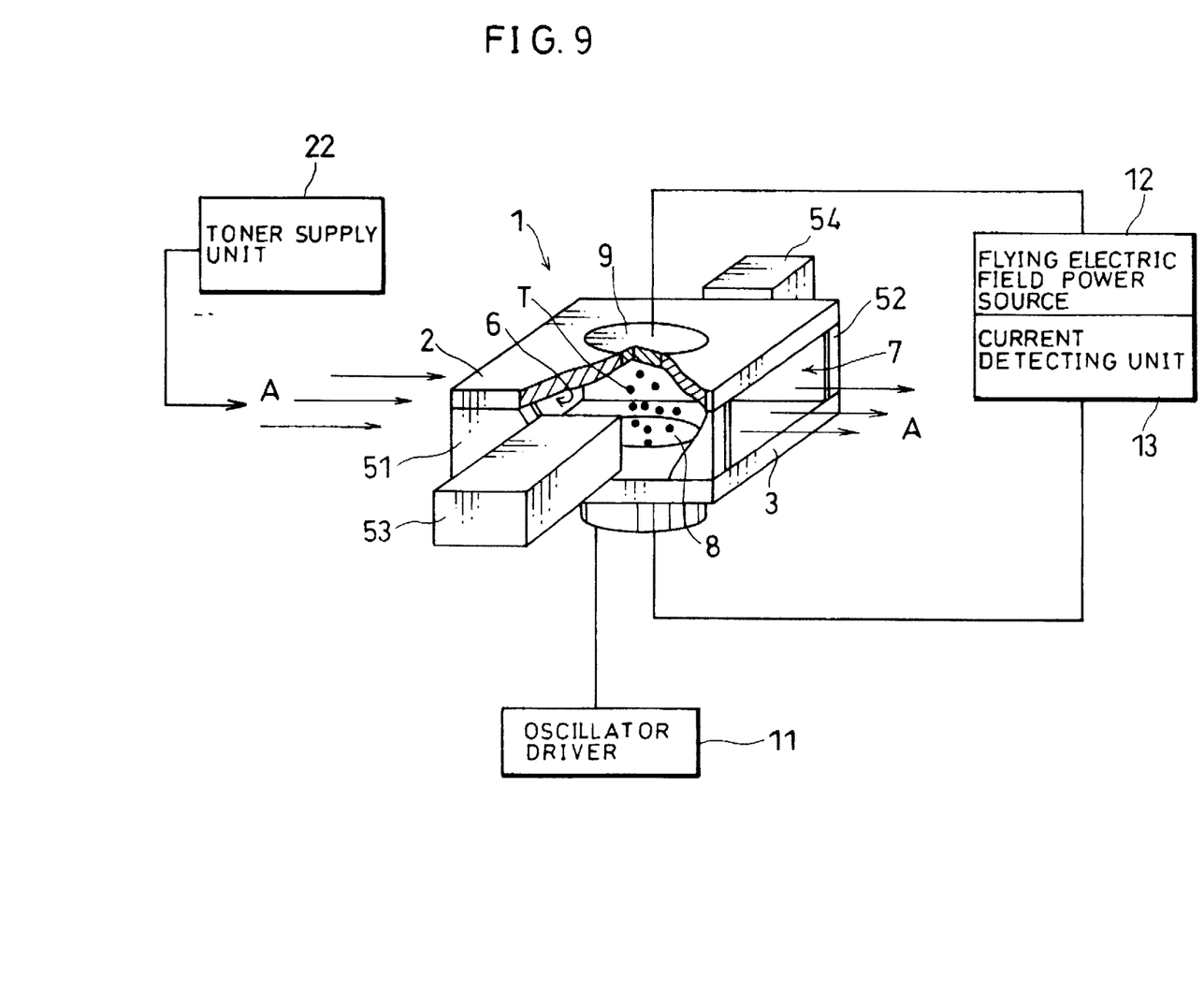
FIG. 9 is an explanatory view schematically showing an entire structure of a measuring chamber of a measuring device for amount of charge of developer in accordance with a still another embodiment with a perspective view of a measuring chamber and a block diagram of respective means connected thereto.
Figure 10:
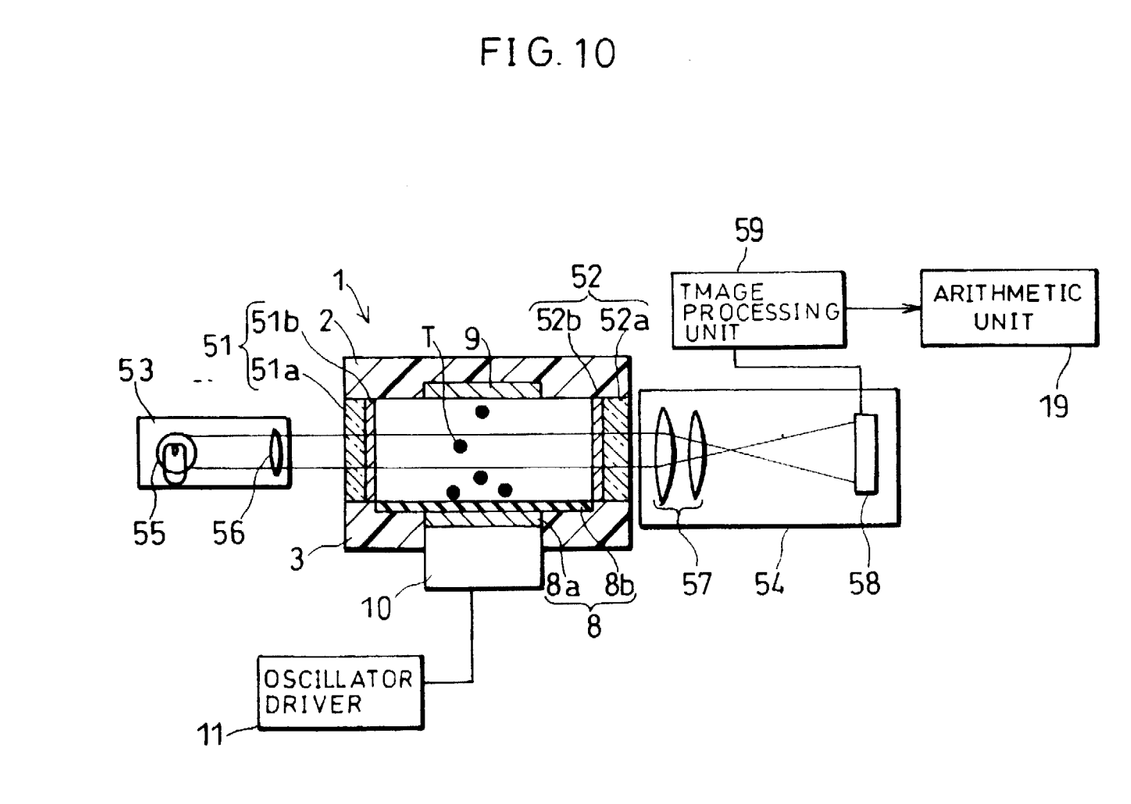
FIG. 10 is a longitudinal cross-sectional view of the structure shown in FIG. 9.

The following descriptions will discuss another embodiment of the present invention with reference to FIG. 9 and FIG. 10. Here, members having the same function as aforementioned embodiments will be designated by the same reference numerals, and thus the descriptions thereof shall be omitted here.

As shown in FIG. 9 and FIG. 10, the measuring device for amount of charge of developer is provided with side wall portions 51 and 52 in replace of the side wall portions 4 and 5 shown in FIG. 1. As shown in FIG. 10, these side wall portions 51 and 52 are arranged so as to have high resistance electrically conductive layers 51b and 52b on the inner side of transparent plates 51a and 52a. The transparent plates 51a and 52a are made of glass plates. The high resistance electrically conductive layers 51b and 52b are formed, respectively, for example, by evaporating ($SnO_2$+Cr), so as to have a thickness of 0.13 μm and a specific resistance of 3 MΩ/cm².

On the outside of the measuring chamber 1, an exposure unit 53 is provided so as to face the side wall portion 51, and a light receiving unit 54 is provided so as to face the side wall portion 52 and the exposure unit 53. The exposure unit 53 includes a light source 55 and a lens 56, and the light receiving unit 54 includes a magnifying optical system 57 and a CCD sensor 58 (image pickup element). An output terminal of the CCD sensor 58 is connected to an image processing unit 59, and an output terminal of the image processing unit 59 is connected to the arithmetic unit 19.

In the described arrangement, when performing the measurement of the amount of charge of the toner T, as explained in the first embodiment, first, a cleaning of the inside of the measuring chamber 1 is performed, and then, a group of the toner T is supplied onto the lower electrode 8 in the measuring chamber 1. Then, with an application of a toner flying electric field, the lower electrode 8 starts oscillating. This, in turn, actuates the exposure unit 53 and the light receiving unit 54. As a result, the toner T on the lower electrode 8 becomes like smoke, and reaches the upper electrode 9. In this state, a light beam is projected from a light source 55 onto the toner T placed between the lower electrode 8 and the upper electrode 9, and an image of the toner T is magnified by the magnifying optical system 57, and is detected by the CCD sensor 58. The output from the CCD sensor 58 is processed by the image processing unit 59, and the size of the toner T is detected. This information is inputted to the arithmetic unit 19, and as the specific gravity of the toner T is stored in the arithmetic unit 19, the weight of the toner T can be calculated based on the information. Moreover, as the dielectric constant of the toner T is also known, by considering the shape of the toner T to be spherical, the arithmetic unit 19 can calculate the theoretical value for the amount of charge of the toner T based on the above information. Furthermore, in the arithmetic unit 19, the number of the toner particles T can be determined from the total amount of charge and the amount of charge of each toner particle T.

Additionally, as the side wall portions 51 and 52 have the high resistance electrically conductive layer s 51b and 52b on the inner surf ace side, a uniform electric field is generated between the lower electrode 8 and the upper electrode 9 even when the charged toner T adheres to the inner surfaces of the side wall portions 51 and 52 without being disturbed by the effect of the charge of the toner T. Therefore, without being disturbed by the electric field, the toner T can fly accurately with an application of each flying electric field voltage, thereby permitting an accurate measurement of the amount of charge of the toner T.

In the described measuring device for amount of charge of developer, the toner T on the lower electrode 8 becomes like smoke by the oscillation of the lower electrode 8. This permits the shape of the toner T to be detected by the light receiving unit 54 not with respect to the toner T flying at high speed from the lower electrode 8 to the upper electrode 9 but with respect to the toner T floating in a space between the lower electrode 8 and the upper electrode 9 which are moving at low speed. Therefore, the shape of the toner T can be detected with accuracy, thereby obtaining accurate results of respective calculations based on the obtained information.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A measuring device for amount of charge of developer comprising:

an upper electrode;

a lower electrode provided under said upper electrode, said upper electrode and said lower electrode being provided in parallel so as to face each other;

wherein an upper surface of said lower electrode is covered with an electrically insulating film;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode, and arithmetic means for computing a total amount of charge of the developer adhering to said upper electrode based on a change in amount of current detected by said current detection means.

2. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

wherein said lower electrode is provided so as to be capable of oscillating back and forth in a direction facing said upper electrode; and wherein said lower electrode includes oscillation means for oscillating said lower electrode at a predetermined frequency, where said oscillation means oscillates said lower electrode at frequency in a range of from 100 to 1,000 Hz.

3. The measuring device for amount of charge of developer as set forth in claim 2, wherein:

said lower electrode oscillates said lower electrode at frequency in a range of from 700 to 900 Hz.

4. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means; and wherein upon completing each current detecting operation by said current detection means with an applied predetermined flying electric field voltage, said flying electric field voltage application means sequentially alters the flying electric field voltage in a direction of accelerating a flying movement of the developer from said lower electrode towards said upper electrode.

5. The measuring device for amount of charge of developer as set forth in claim 4, further comprising:

developer supply means for supplying the developer onto said lower electrode; and cleaning means for removing the developer remaining between said lower electrode and said upper electrode, wherein said flying electric field voltage application means performs a measurement with respect to the developer supplied onto said lower electrode by said developer supply means, while continuously varying the flying electric field voltage, and thereafter, the cleaning means is actuated.

6. The measuring device for amount of charge of developer as set forth in claim 4, further comprising:

developer supply means for supplying the developer onto said lower electrode; and cleaning means for removing the developer remaining between said lower electrode and said upper electrode, wherein upon completing each current detecting operation by said current detection means with an applied predetermined flying electric field voltage, a cleaning operation is performed by said cleaning means, and subsequently a developer supplying operation is performed by said developer supply means.

7. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

developer supply means for supplying the developer by an air-flow carrying the developer onto said lower electrode; and wherein said developer supply means serves as cleaning means for removing the developer remaining between said lower electrode and said upper electrode.

8. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

wherein said lower electrode is provided so as to be capable of oscillating back and forth in a direction facing said upper electrode;

wherein said lower electrode includes oscillation means for oscillating said lower electrode at a predetermined frequency;

a pair of side wall portions made of a material transmissible to light provided between said upper electrode and said lower electrode, said side wall portions being provided so as to face each other via a flying region of the developer;

a light source for projecting light onto the developer, said light source being provided on an outer surface side of one of said side wall portions;

a magnifying optical system provided at position facing said light source on the outer surface side of the other side wall portion;

photo-electric conversion means for converting an image that is magnified by said magnifying optical system into an electric signal, said photo-electric conversion means being provided at position facing said light source on the outer surface side of the other side wall portion; and image processing means connected to said photoelectric conversion means, for extracting image information of the developer based on the electric signal obtained from said photo-electric conversion means.

9. The measuring device for amount of charge of developer as set forth in claim 8, wherein:

said image processing means outputs information indicative of a particle diameter of the developer, and said arithmetic means computes a weight of the developer based on the information and a given specific gravity of the developer.

10. The measuring device for amount of charge of developer as set forth in claim 8, wherein:

said image processing means outputs information indicative of a particle diameter of the developer, and said arithmetic means computes a theoretical amount of charge of the developer based on the information and a given dielectric constant of the developer.

11. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

wherein said upper electrode and said lower electrode are inclined with respect to a horizontal direction; and an upper portion of said lower electrode corresponds to a developer supplying side from which the developer is supplied onto said lower electrode, and a lower portion of said lower electrode corresponds to a developer discharging side from which the developer from said lower electrode is discharged.

12. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

cleaning means for removing the developer remaining between said lower electrode and said upper electrode; and wherein said cleaning means includes cleaning voltage application means for applying a voltage for generating an alternating electric field onto said upper electrode, a direction of said alternating electric field being subject to reverse.

13. The measuring device for amount of charge of developer as set forth in claim 12, wherein:

said lower electrode is provided so as to be capable of oscillating back and forth in a direction facing said upper electrode, and said lower electrode includes oscillation means for oscillating said lower electrode at a predetermined frequency.

14. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means;

side wall portions provided between said lower electrode and said upper electrode so as to face each other via a space formed therebetween; and an electric resistance layer having an electrically conductive property is formed on an inner surface of the side wall portions.

15. A measuring device for amount of charge of developer comprising:

an upper electrode;

a lower electrode provided under said upper electrode, said upper electrode and said lower electrode being provided in parallel so as to face each other;

flying electric field voltage application means for applying a flying electric field voltage to said upper electrode, said flying electric field voltage generating an electric field which allows a developer to fly from said lower electrode to said upper electrode;

current detection means for detecting a current flowing in said upper electrode;

arithmetic means for computing a total amount of charge of the developer adhering to said upper electrode based on a change in amount of current detected by said current detection means; and wherein said arithmetic means computes a number of particles of the developer, that reach said upper electrode based on the change in amount of current detected by said current detection means and an amount of charge of each particle of the developer from the number of particles of the developer and the total amount of charge.

16. The measuring device for amount of charge of developer as set forth in claim 15, wherein:

said lower electrode is provided so as to be capable of oscillating back and forth in a direction facing said upper electrode; and said lower electrode includes oscillation means for oscillating said lower electrode at a predetermined frequency.

* * * * *